United States Patent
Spory

(10) Patent No.: US 11,508,680 B2
(45) Date of Patent: Nov. 22, 2022

(54) SOLDER BALL APPLICATION FOR SINGULAR DIE

(71) Applicant: Global Circuit Innovations Inc., Colorado Springs, CO (US)

(72) Inventor: Erick Merle Spory, Colorado Springs, CO (US)

(73) Assignee: Global Circuit Innovations Inc., Colorado Springs, CO (US)

( * ) Notice: Subject to any disclaimer, the term of this patent is extended or adjusted under 35 U.S.C. 154(b) by 92 days.

(21) Appl. No.: 17/097,162

(22) Filed: Nov. 13, 2020

(65) Prior Publication Data
US 2022/0157749 A1 May 19, 2022

(51) Int. Cl.
*H01L 23/00* (2006.01)

(52) U.S. Cl.
CPC .............. *H01L 24/03* (2013.01); *H01L 24/05* (2013.01); *H01L 24/13* (2013.01); *H01L 24/16* (2013.01); *H01L 24/81* (2013.01); *H01L 24/98* (2013.01); *H01L 2224/0381* (2013.01); *H01L 2224/0382* (2013.01); *H01L 2224/0401* (2013.01); *H01L 2224/05083* (2013.01); *H01L 2224/05084* (2013.01); *H01L 2224/05144* (2013.01); *H01L 2224/05155* (2013.01); *H01L 2224/05164* (2013.01); *H01L 2224/05573* (2013.01); *H01L 2224/13007* (2013.01); *H01L 2224/16145* (2013.01); *H01L 2224/16227* (2013.01); *H01L 2224/8121* (2013.01); *H01L 2224/81815* (2013.01); *H01L 2224/98* (2013.01)

(58) Field of Classification Search
CPC ................ H01L 24/03; H01L 24/05; H01L 2224/05083; H01L 2224/05144; H01L 2224/05155
See application file for complete search history.

(56) References Cited

U.S. PATENT DOCUMENTS

| | | |
|---|---|---|
| 4,426,769 A | 1/1984 | Grabbe |
| 4,622,433 A | 11/1986 | Frampton |
| 5,064,782 A | 11/1991 | Nishiguchi |
| 5,219,794 A | 6/1993 | Satoh |
| 5,243,756 A | 9/1993 | Hamburgen et al. |
| 5,517,127 A | 5/1996 | Bergeron |
| 5,598,031 A | 1/1997 | Groover et al. |
| 5,783,868 A | 7/1998 | Galloway |
| 5,847,467 A | 12/1998 | Wills |

(Continued)

FOREIGN PATENT DOCUMENTS

WO    WO2011-101272 A1    8/2011

OTHER PUBLICATIONS

Wikipedia "3D Printing" reference, downloaded Jan. 12, 2015.
(Continued)

*Primary Examiner* — Dale E Page
*Assistant Examiner* — Wilner Jean Baptiste
(74) *Attorney, Agent, or Firm* — Thomas J. Lavan

(57) ABSTRACT

A method is provided. The method includes one or more of conditioning one or more die pads of a singular die, applying a nickel layer to the one or more die pads, applying a gold layer over the nickel layer, applying a solder paste over the gold layer, applying one or more solder balls to the solder paste, and mating the one or more solder balls to one or more bond pads of another die, a printed circuit board, or a substrate.

7 Claims, 10 Drawing Sheets

(56) References Cited

U.S. PATENT DOCUMENTS

| | | |
|---|---|---|
| 5,936,758 A | 8/1999 | Fisher et al. |
| 6,100,108 A | 8/2000 | Mizuno et al. |
| 6,100,581 A | 8/2000 | Wakefield et al. |
| 6,169,331 B1 | 1/2001 | Manning |
| 6,429,028 B1 | 8/2002 | Young |
| 6,472,725 B1 | 10/2002 | Stroupe |
| 7,759,800 B2 | 7/2010 | Rigg et al. |
| 7,833,880 B2 | 11/2010 | Rizzi |
| 8,421,227 B2 | 4/2013 | Lin |
| 2001/0019176 A1 | 9/2001 | Ahiko et al. |
| 2002/0084528 A1 | 7/2002 | Kim et al. |
| 2002/0182782 A1 | 12/2002 | Farnworth |
| 2003/0127423 A1 | 7/2003 | Dlugokecki |
| 2004/0006150 A1 | 1/2004 | Murray et al. |
| 2004/0040855 A1 | 3/2004 | Batinovich |
| 2004/0056072 A1 | 3/2004 | Chapman et al. |
| 2005/0057883 A1 | 3/2005 | Bolken |
| 2005/0085578 A1 | 4/2005 | Iguchi |
| 2005/0285250 A1 | 12/2005 | Jeong |
| 2006/0068595 A1 | 3/2006 | Seliger et al. |
| 2006/0166406 A1 | 7/2006 | Lin |
| 2007/0007661 A1 | 1/2007 | Burgess |
| 2007/0259470 A1 | 11/2007 | Quenzer et al. |
| 2007/0295456 A1 | 12/2007 | Gudeman |
| 2008/0124547 A1 | 5/2008 | O et al. |
| 2008/0230922 A1 | 9/2008 | Mochizuki |
| 2009/0151972 A1 | 6/2009 | Potter |
| 2009/0160047 A1 | 6/2009 | Otsuka |
| 2010/0007367 A1 | 1/2010 | Spielberger et al. |
| 2010/0079035 A1 | 4/2010 | Matsuzawa et al. |
| 2010/0140811 A1 | 6/2010 | Leal et al. |
| 2010/0200262 A1 | 8/2010 | Mahapatra et al. |
| 2010/0246152 A1 | 9/2010 | Lin et al. |
| 2010/0314754 A1 | 12/2010 | Zhang |
| 2011/0215449 A1 | 9/2011 | Camacho et al. |
| 2011/0298137 A1 | 12/2011 | Pagalia et al. |
| 2012/0177853 A1 | 7/2012 | Gruenwald |
| 2012/0217643 A1 | 8/2012 | Pagalia |
| 2013/0207248 A1 | 8/2013 | Bensoussan et al. |
| 2018/0040529 A1* | 2/2018 | Spory ................ H01L 21/4817 |
| 2018/0350759 A1* | 12/2018 | Yagyu .................... H01L 24/83 |

OTHER PUBLICATIONS

Wikipedia "Screen printing" reference, downloaded Jan. 12, 2015.
sPRO 125 and sPRO 250 Direct Metal SLM Production Printer datasheet, 3DSystems, Part No. 70743, Issue Date Apr. 10, 2012.
MIT article "Liquid Metal Printer Lays Electronic Circuits on Paper, Plastic, and even Cotton", downloaded from MIT Technology Review Nov. 22, 2013, http://www.technologyreview.com/view/521871/liquid-metal-printer-lays-electronic-circuits-on-paper-plastic-and-even-cotton/.
Flip Chips dot com, Tutorial 72—Mar. 2007, Redistribution Layers, article by George A. Riley, PhD, Flipchips dot com website, downloaded Dec. 18, 2011: http://www.flipchips.com/tutorial72.html.

* cited by examiner

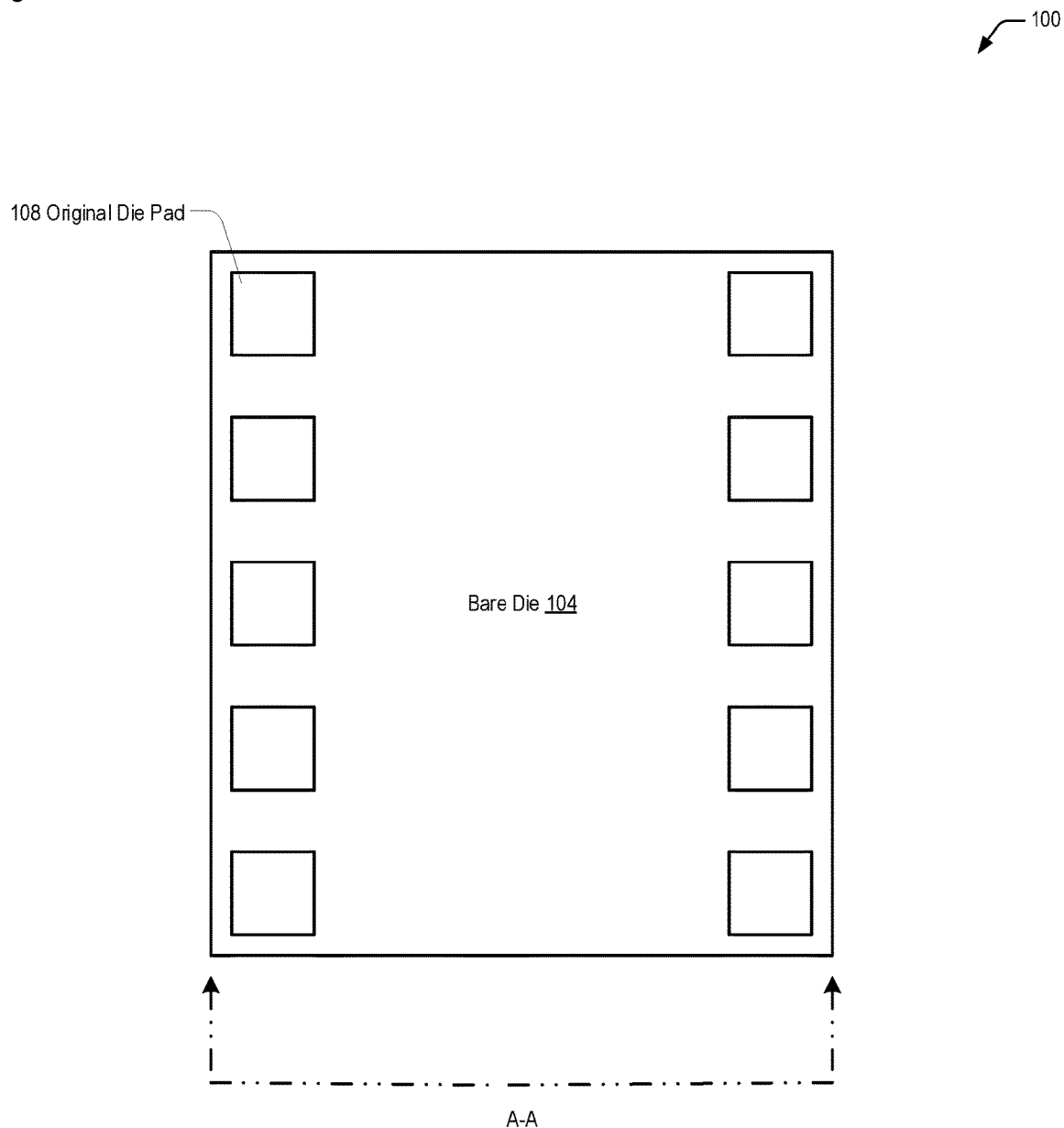
Fig. 1A Bare Die with Die Pads

Fig. 1B  Extracted Die with Die Pads, Ball Bonds, and Bond Wires
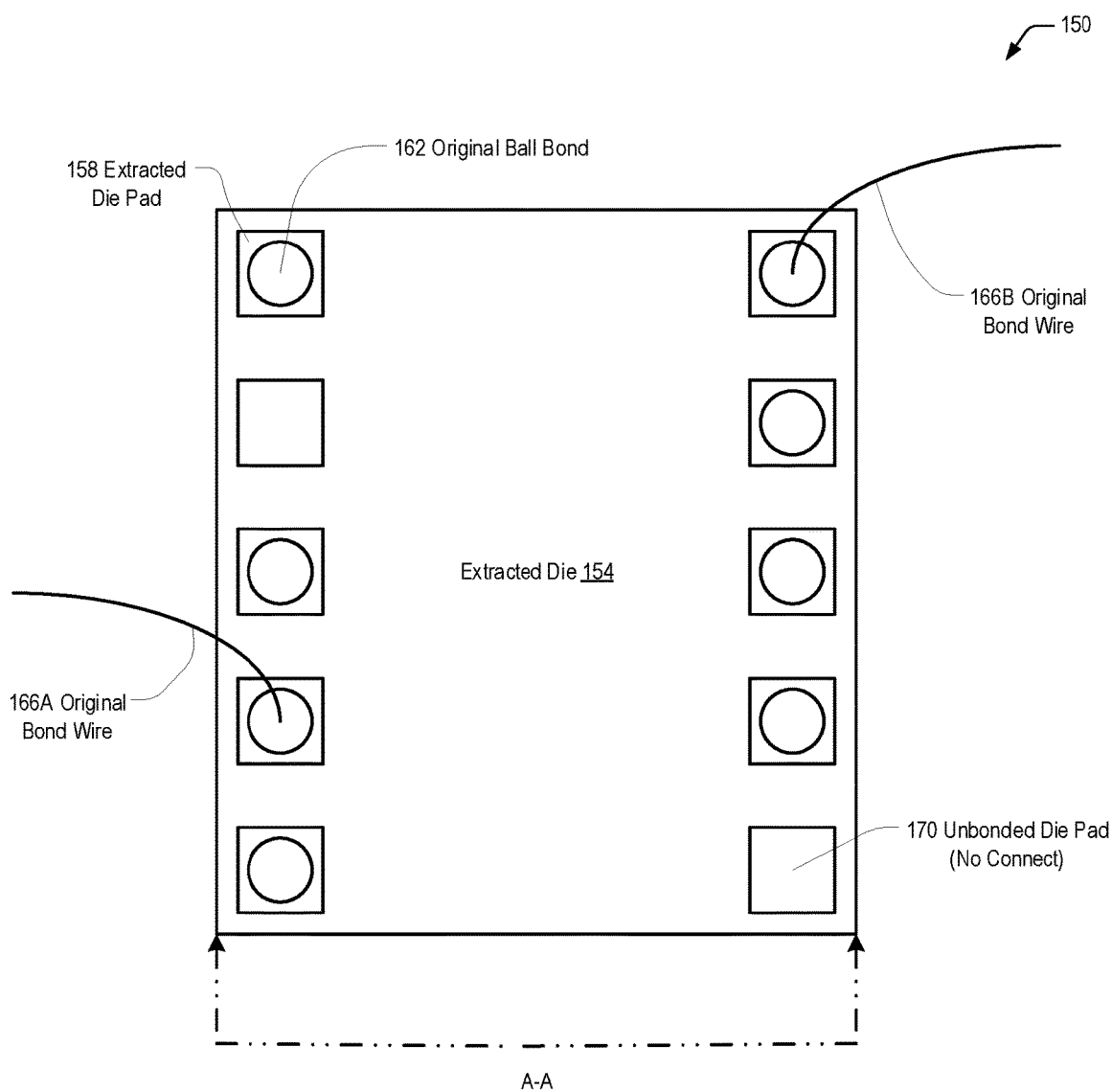

Fig. 2A  Extracted Die Section A-A
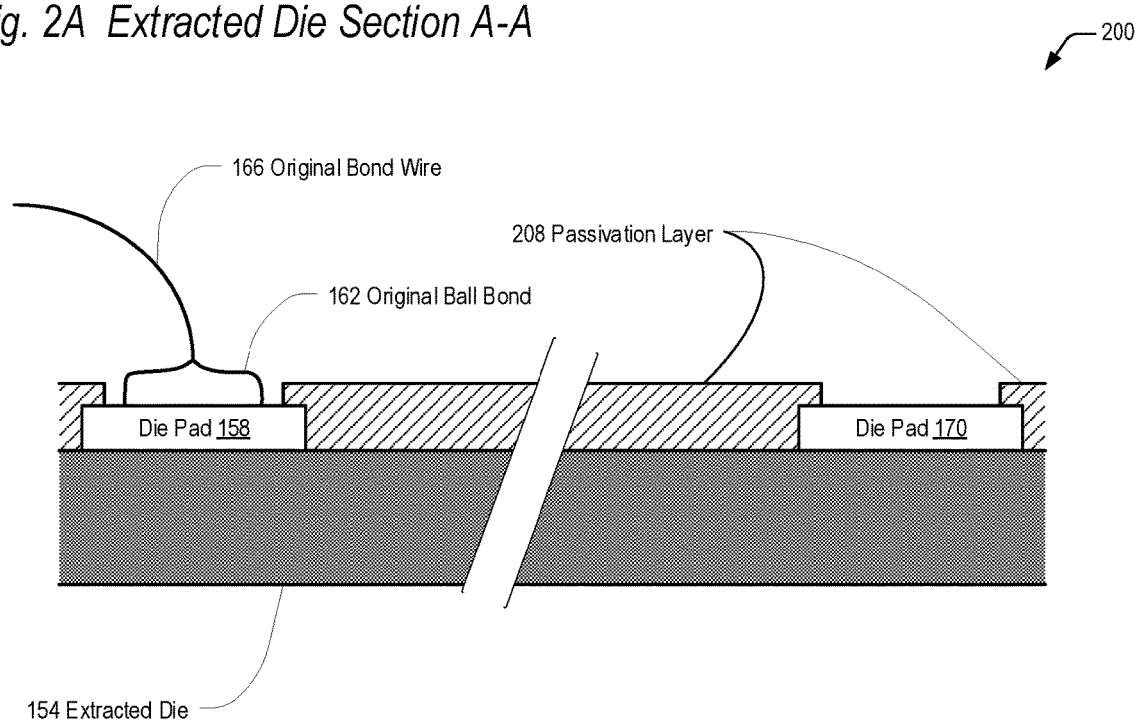
Fig. 2B  Modified Extracted Die Section A-A After Original Ball Bond and Original Bond Wire Removal
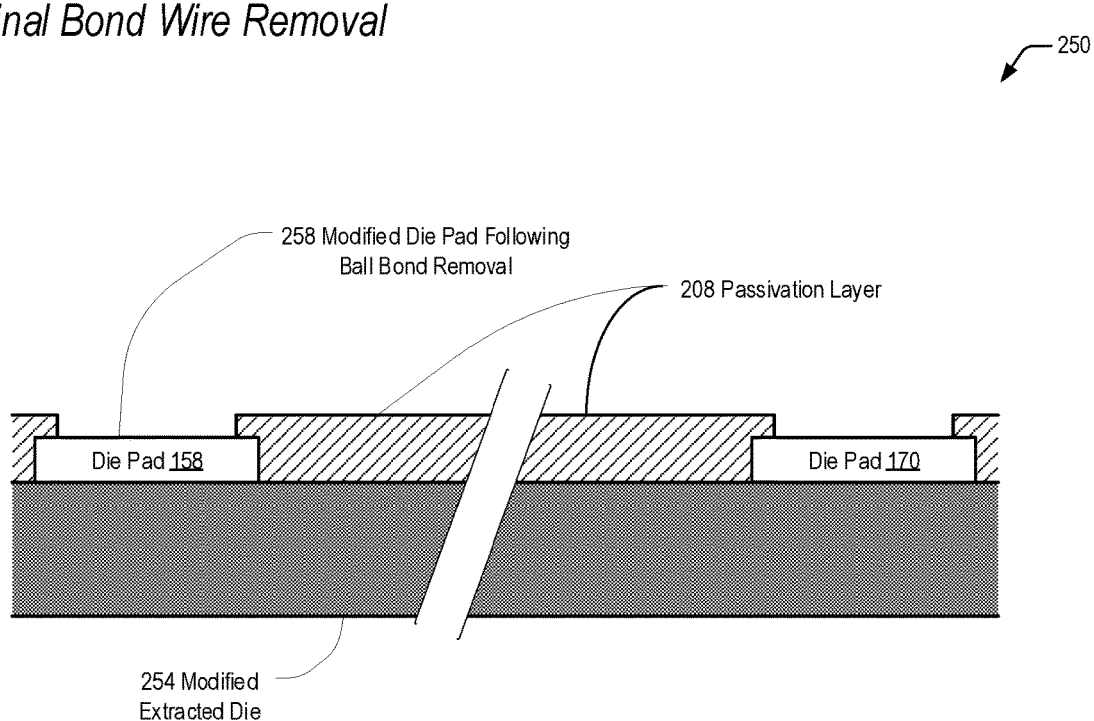

Fig. 3A Electroless Nickel Layer Application Section A-A
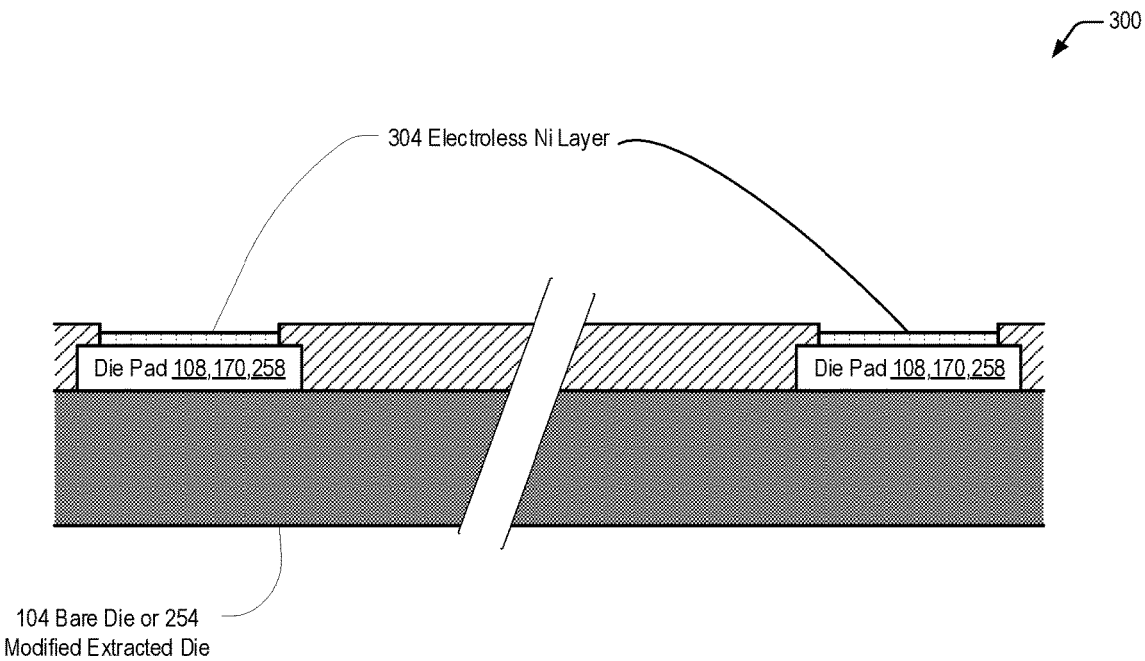
Fig. 3B Electroless Palladium Layer Section A-A
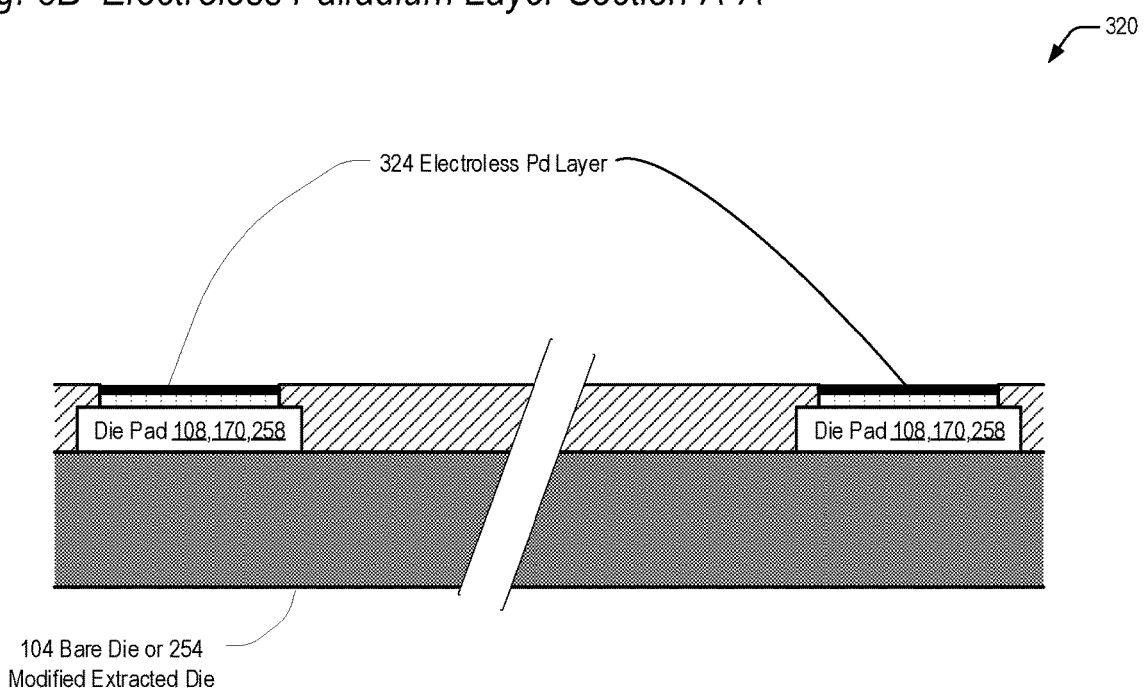

*Fig. 3C Immersion Gold Layer Application Section A-A*
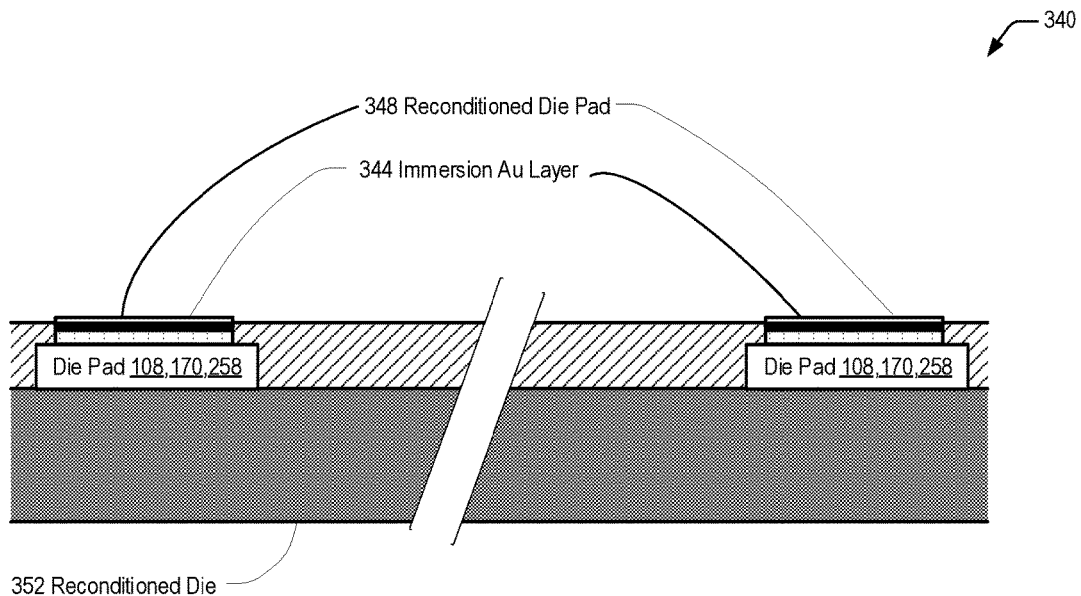
*Fig. 3D Solder Paste Application to Reconditioned Die Pads Section A-A*
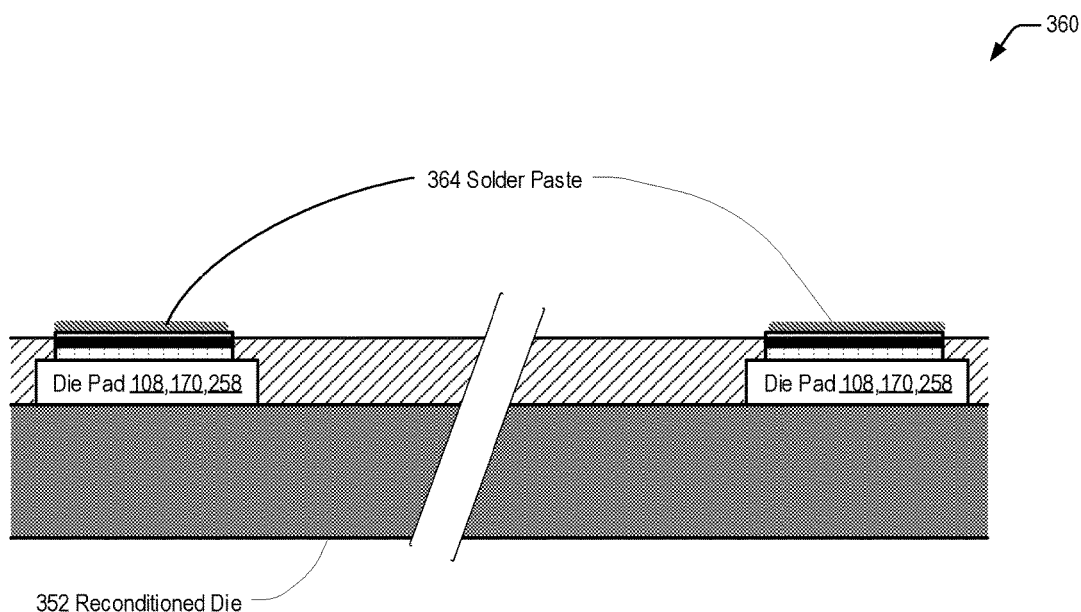

Fig. 3E  New Solder Ball Placement Section A-A
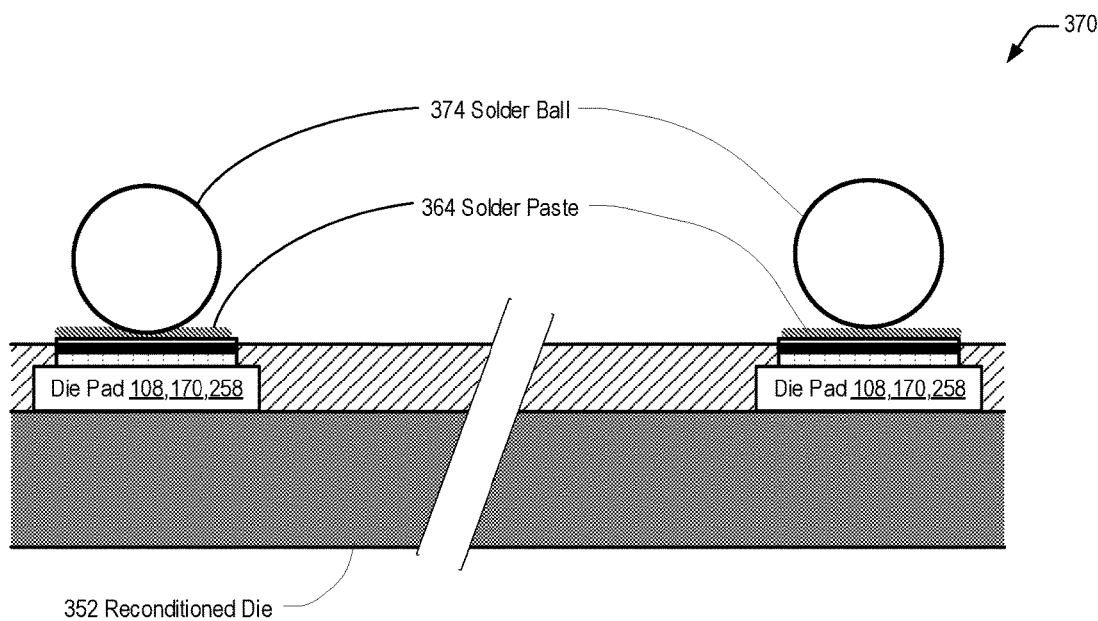
Fig. 3F  New Solder Balls after Thermal Profile
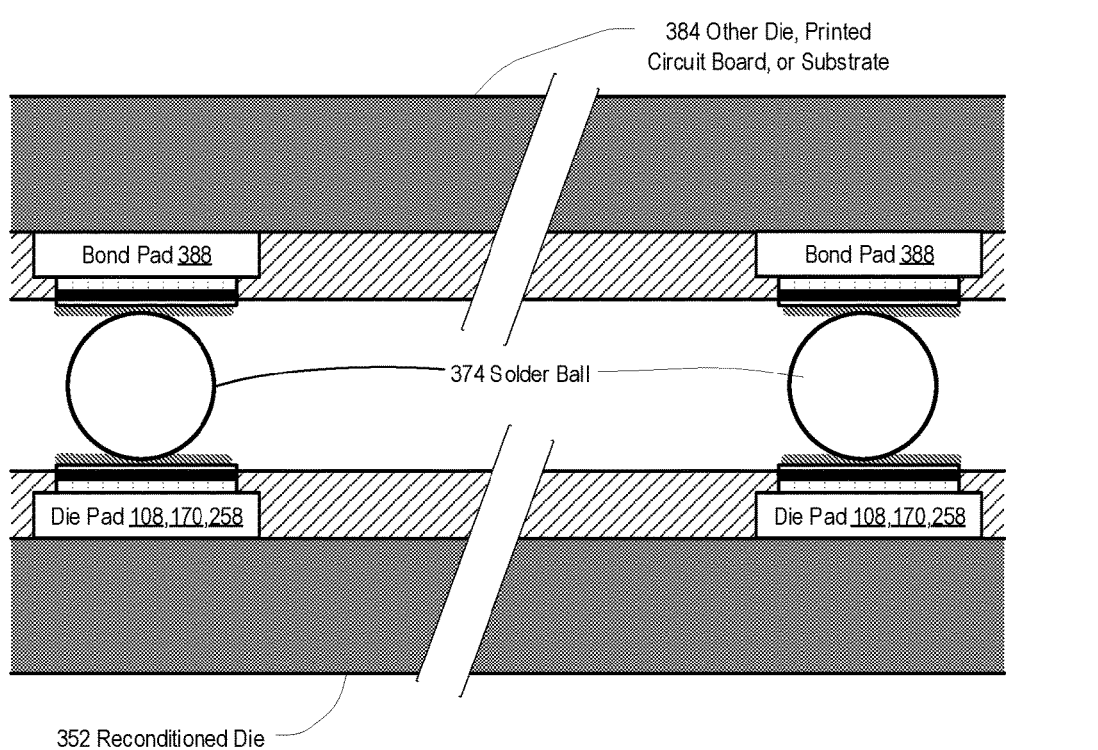

*Fig. 4A Solder Balls Between Die and Substrate*
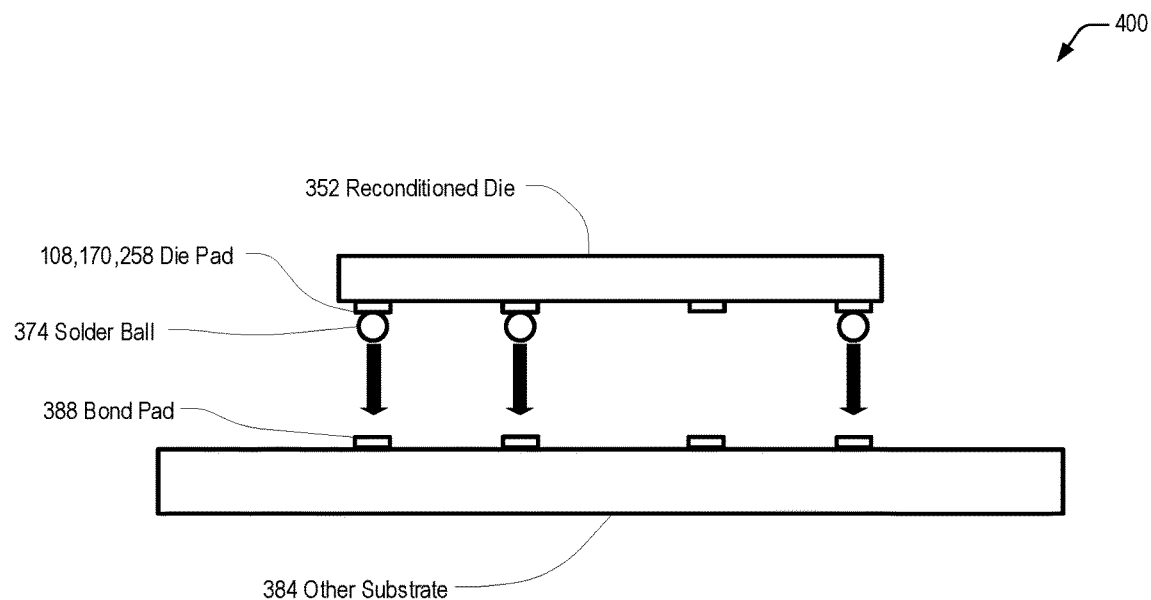
*Fig. 4B Solder Balls Bonded to Die and Substrate*
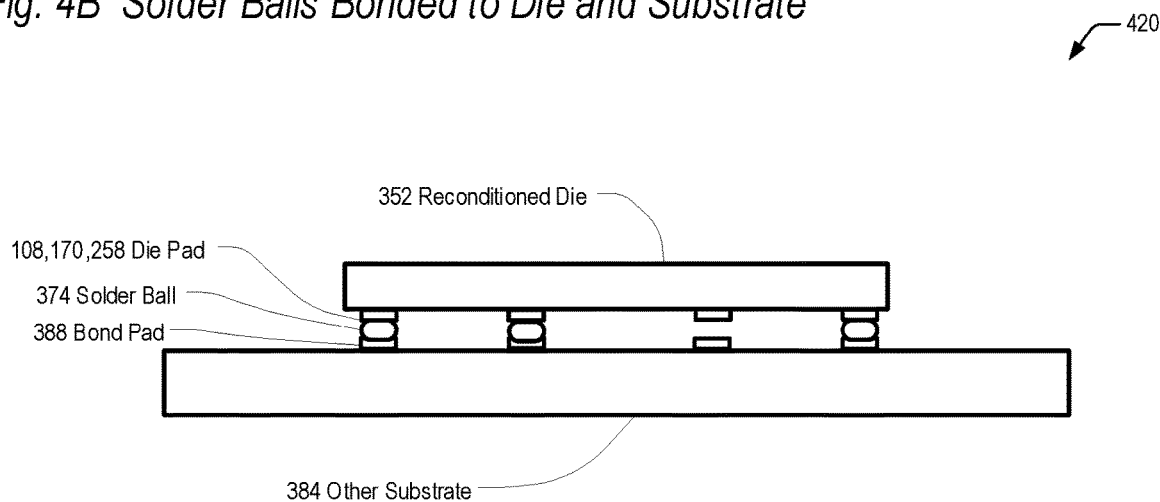

Fig. 5A  Reconditioning Process for Bare Die
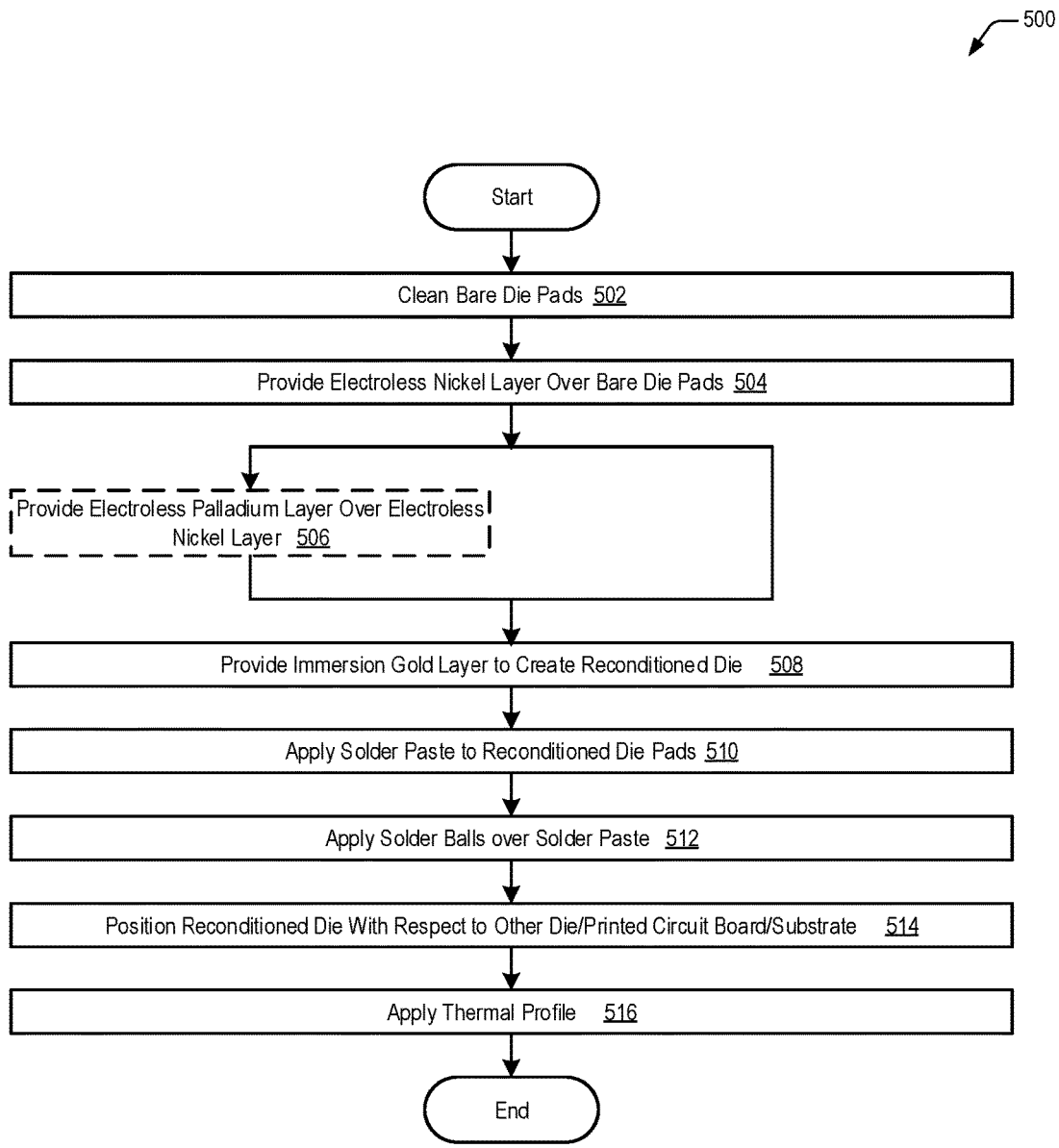

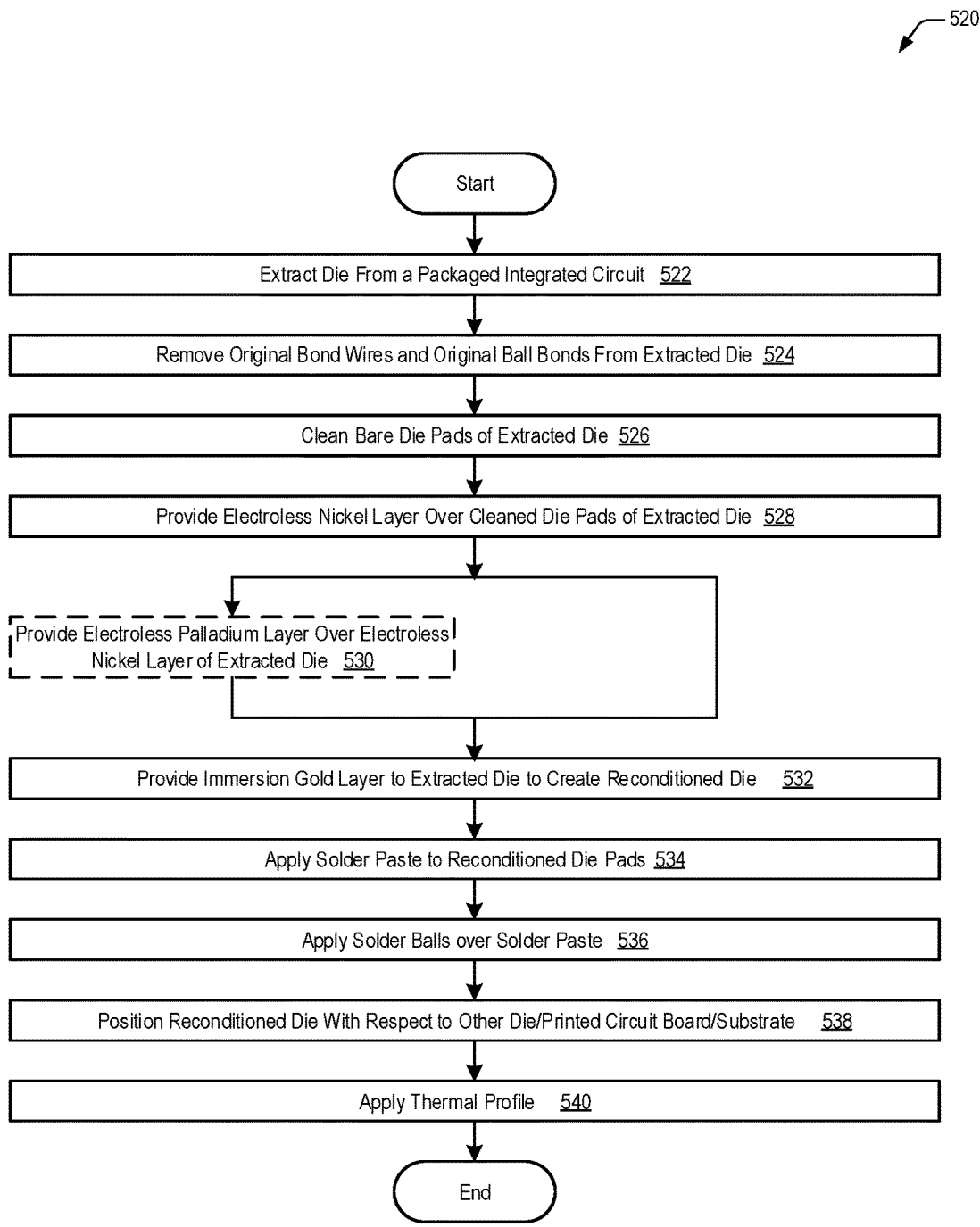
Fig. 5B Full Reconditioning Process for Extracted Die

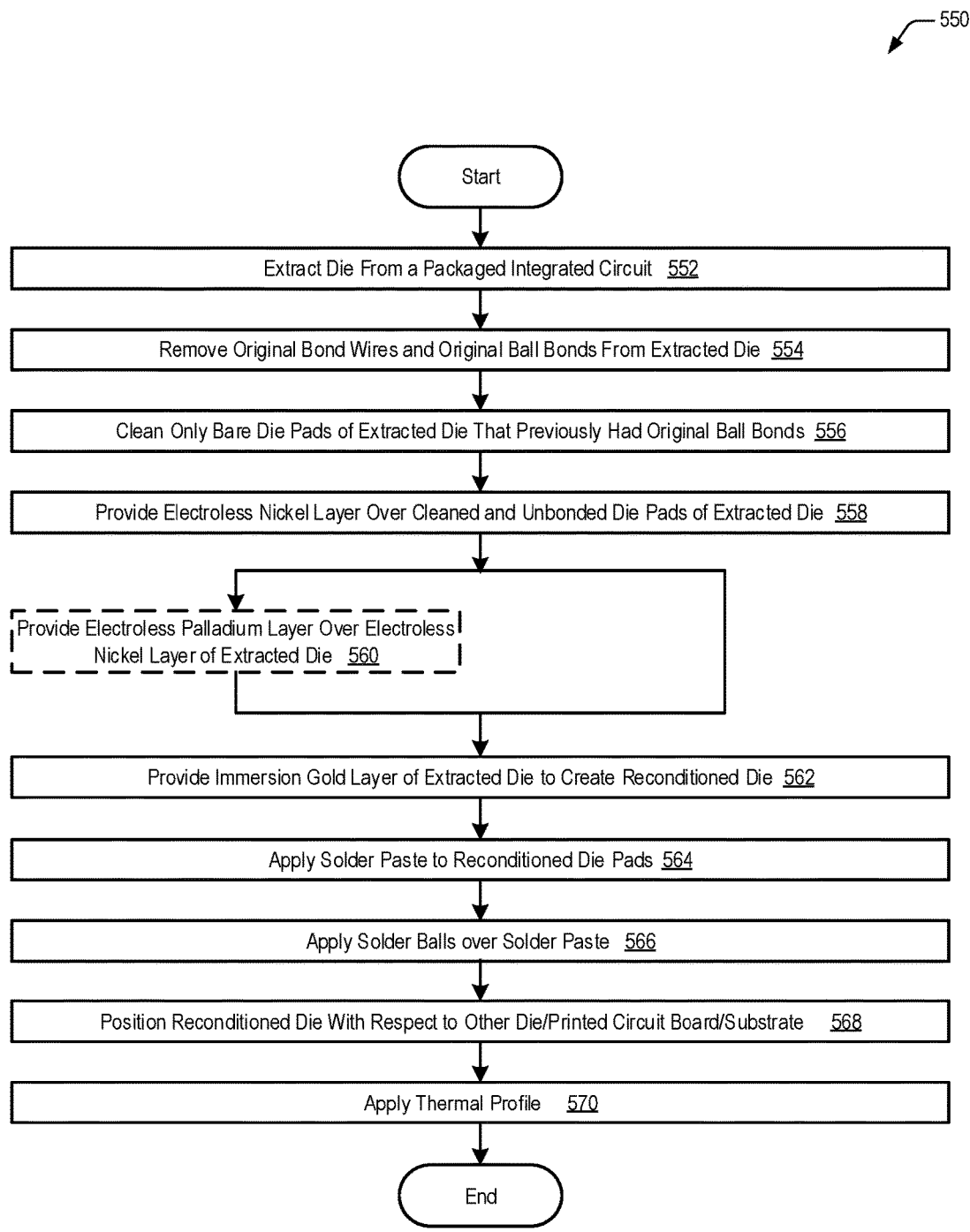
Fig. 5C Partial Reconditioning Process for Extracted Die

SOLDER BALL APPLICATION FOR SINGULAR DIE

FIELD

The present invention is directed to singular die processing. In particular, the present invention is directed to methods and apparatuses for applying solder balls to reconditioned die pads for a singular die.

BACKGROUND

Integrated circuits are available in many different packages, technologies, and sizes. Most integrated circuits are available in plastic packages, which are generally intended for commercial operating environments at a low cost. Commercial operating environments have a specified operating range from 0° C. to 70° C. Integrated circuits for military applications have historically been packaged in either metal or ceramic hermetic packages, which are able to work reliably in more demanding environments than commercial integrated circuits. Military operating environments have a specified operating range from −55° C. to 125° C. In order to save costs, the military has purchased integrated circuits through COTS (Commercial Off-The-Shelf) programs. However, these components are generally commercial grade components in plastic packages, and not intended for demanding environments requiring the broader temperature range reliability and durability of ceramic and metal hermetically packaged integrated circuits.

Depending on size and complexity, integrated circuits are available in a wide range of packages. Although many older integrated circuits were packaged using through-hole technology packages, surface mount packages have dominated over the past several decades. Surface mount packages generally have circuit density, cost, and other advantages over through-hole integrated circuits. Examples of through-hole packages include DIP (dual-in-line plastic) and PGA (pin grid array). Examples of surface mount packages include SOIC (small-outline integrated circuit) and PLCC (plastic leaded chip carrier).

In many cases, products requiring specific integrated circuits are in production or service for a longer time period than the manufacturing lifetime of a given integrated circuit. In such cases, it is not uncommon for these specific parts to become obsolete or become unable to be purchased. For example, in a typical month, about 3% of all packaged integrated circuit product types become obsolete. One mitigating approach to this issue is to buy a sufficient lifetime inventory of spares for integrated circuits that are likely to become obsolete at a future date. However, this may be costly if a large quantity of integrated circuits needs to be purchased as spares. It also may result in far more spares being purchased that are actually required, since projected future needs may only be a rough estimate. When spares are needed in the future when an IC is no longer in active production, the exact functioning ICs that are still available may be in a different package than is required, since popular ICs are typically offered in multiple package options. For example, spares may be available in plastic DIP packages while the using assemblies require SOIC packages.

SUMMARY

The present invention is directed to solving disadvantages of the prior art. Specifically, a singular extracted die can be utilized in a flip-chip application or installed into a flip-chip package architecture in accordance with embodiments of the present invention and respective provided method. The method includes one or more of conditioning one or more die pads of a singular die. applying a nickel layer to the one or more die pads, applying a gold layer over the nickel layer, applying a solder paste over the gold layer, applying one or more solder balls to the solder paste, and mating the one or more solder balls to one or more bond pads of another die, a printed circuit board, or a substrate.

In accordance with another embodiment of the present invention, a device is provided. The device includes one or more of a singular die, which includes one or more reconditioned die pads, and one of another die, a printed circuit board, and a substrate. The reconditioned die pads include die pads of the singular die with a plurality of metallic layers applied. The other die, printed circuit board, and substrate include one or more bond pads. One or more solder balls are between the one or more reconditioned die pads and the one or more bond pads.

An advantage of the present invention is that it does not require a mask to produce a masked metallic layer consistent with solder ball deposition, such as a redistribution layer (RDL) for a singular die. This saves production time and therefore enhances cost effectiveness for processing one or more singular dice.

Another advantage of the present invention is it provides an improved die pad metallic composition to conventional aluminum die pad surfaces. By providing ENEPIG die pad plating, a preferred gold layer is used for solder ball application. Gold is highly conductive and heat resistant, and serves as an excellent barrier to corrosion. Most commonly, gold plating is applied on top of nickel and in some embodiments palladium. Gold acts as a corrosion inhibitor by preventing oxides from penetrating pores in the surface of the gold layer. It also prevents the diffusion of other metals into the gold surface, causing it to tarnish. This may happen with zinc and copper layers.

An additional advantage of the present invention is that it provides a 3D printed hermetic encapsulant over an extracted die, a side-fill compound, and areas of a hermetic substrate. 3D printers are able to apply material in successive layers to achieve a desired thickness, and with greater precision than many conventional processes may apply the material.

Additional features and advantages of embodiments of the present invention will become more readily apparent from the following description, particularly when taken together with the accompanying drawings.

BRIEF DESCRIPTION OF THE DRAWINGS

FIG. 1A is a diagram illustrating a bare die with die pads in accordance with embodiments of the present invention.

FIG. 1B is a diagram illustrating an extracted die with die pads, ball bonds, and bond wires in accordance with embodiments of the present invention.

FIG. 2A is a diagram illustrating a section A-A of an extracted die in accordance with embodiments of the present invention.

FIG. 2B is a diagram illustrating a section A-A of a modified extracted die after original ball bond and bond wire removal in accordance with embodiments of the present invention.

FIG. 3A is a diagram illustrating a section A-A of an electroless nickel layer application in accordance with embodiments of the present invention.

FIG. 3B is a diagram illustrating a section A-A of an electroless palladium layer application in accordance with embodiments of the present invention.

FIG. 3C is a diagram illustrating a section A-A of an immersion gold layer application in accordance with embodiments of the present invention.

FIG. 3D is a diagram illustrating a section A-A of a reconditioned die after solder paste application in accordance with embodiments of the present invention.

FIG. 3E is a diagram illustrating a section A-A of new solder ball placement in accordance with embodiments of the present invention.

FIG. 3F is a diagram illustrating a section A-A of new solder balls positioned prior to a thermal profile in accordance with embodiments of the present invention.

FIG. 4A is a diagram illustrating solder balls between a die and a substrate in accordance with embodiments of the present invention.

FIG. 4B is a diagram illustrating solder balls bonded to a die and a substrate in accordance with embodiments of the present invention.

FIG. 5A is a flowchart illustrating a reconditioning process for a bare die in accordance with a first embodiment of the present invention.

FIG. 5B is a flowchart illustrating a full reconditioning process for an extracted die in accordance with a second embodiment of the present invention.

FIG. 5C is a flowchart illustrating a partial reconditioning process for an extracted die in accordance with a third embodiment of the present invention.

DETAILED DESCRIPTION

In most cases, it is most efficient to modify many semiconductor dice at the same time at the wafer level. Wafer size dictates the number of semiconductor dice that may be processed at the same time, and various masks, including redistribution layers (RDLs) may be used to modify a wafer. However, wafer-level modification may not be available in some cases—requiring individual or singular die modification instead. A singular die may be obtained any time following separating individual dice from a wafer. A singular die may be a new unpackaged bare die, or an extracted die taken from a packed integrated circuit device. A bare die generally has no metallic or chemical contamination on any die pads since it has not yet been packaged.

Referring now to FIG. 1A, a diagram illustrating a bare die with die pads 100, in accordance with embodiments of the present invention is shown. The bare die 104 is an individual semiconductor die or substrate, and is usually fabricated in suitable technologies including Silicon (Si), Gallium Arsenide (GaAs), or Silicon Carbide (SiC). Bare die 104 may have a single die or multiple interconnected dice. Regardless whether bare die 104 includes a single die or multiple interconnected dice, die circuitry is connected to original die pads 108 of the bare die 104. Original die pads 108 may generally be aluminum (Al) or copper (Cu) alloy pads. Section A-A provides a reference to an end-on view for other drawings to illustrate the construction and methods of the present invention.

Referring now to FIG. 1B, a diagram illustrating an extracted die with die pads, ball bonds, and bond wires 150, in accordance with embodiments of the present invention is shown. In most embodiments, an extracted die 154 is an individual semiconductor die or substrate, and may be fabricated in suitable technologies including Silicon (Si) Gallium Arsenide (GaAs), or Silicon Carbide (SiC). Extracted die 154 may have a single die or multiple interconnected dice. Regardless whether extracted die 154 includes a single die or multiple interconnected dice, die circuitry is connected to extracted die pads 158, 170 of the extracted die 154. Extracted die pads 158 and unbonded die pads 170 may generally be aluminum (Al) or copper (Cu) alloy pads. Each previously used extracted die pad 158 of the extracted die 154 may have an original ball bond 162 present (usually gold), and possibly an associated original bond wire 166, shown as original bond wires 166A and 166B. When the extracted die 154 was present in whatever previous package was used for the extracted die 154, original bond wires 166 connected each of the original ball bonds 162 to a lead or a downbond of the previous package. FIG. 1B illustrates an exemplary extracted die 154, after it has been removed from a previous package. Therefore, some original bond wires 166 have been removed and only original ball bonds 162 and two original bond wires 166A, 166B remain. Depending on the specific extracted die 154, one or more unbonded die pads 170 may also be present—where no original ball bond 162 and original bond wire 166 previously existed. Unbonded die pads 170 generally indicate a no connect to the previous package leads, and may or may not be connected to other circuitry of the extracted die 154. Section A-A provides a reference to an end-on view for other drawings to illustrate the construction and methods of the present invention.

Referring now to FIG. 2A, a diagram illustrating a section A-A of an extracted die 200, in accordance with embodiments of the present invention is shown. FIGS. 2A-2B illustrate a preferred reconditioning process to be applied to at least extracted die pads 158, and possibly unbonded die pads 170, for an extracted die 154 prior to assembling into a new hermetic assembly.

Extracted die 154 includes one or more Aluminum (Al) or other metal(s) die pads 158 and/or 170. A passivation layer 208 may be applied over an extracted die substrate in order to protect the circuits of the die substrate, and the passivation layer 208 is relieved at each of the extracted die pads 158, 170 in order to provide bonding access.

Where original ball bonds 162 and original bond wires 166 are applied to die pads, the die pads are extracted die pads 158. Where no original ball bonds 162 and original bond wires 166 are applied to die pads, the die pads are unbonded die pads 170. FIG. 2A illustrates the point at which an extracted die 154 has been removed from its original package and one or more original ball bonds 162 and original bond wires 166 are present.

Referring now to FIG. 2B, a diagram illustrating a section A-A of a modified extracted die after original ball bond and bond wire removal 250, in accordance with embodiments of the present invention is shown. A modified extracted die 254 is an extracted die 154 with the original ball bonds 162 and original bond wires 166 removed. Although in some embodiments original ball bonds 162 may be removed by mechanical means, in most cases it is preferable to use chemical removal means by known processes. FIG. 2B illustrates the original ball bond 162 and original bond wire 166 removed from the extracted die pad 158. Not shown in FIG. 2B is that after removing the original ball bond 162 and original bond wire 166, some amount of intermetallic residue may be present on the extracted die pads 158. This generally requires removal to make sure there are no impurities or residue on the extracted die pads 158. The residue removal is referred herein as conditioning the die pads. Removal is preferably performed using a mild acid wash. The acid wash is followed by an acid rinse that together removes surface oxides present on the extracted die pads 158. In some embodiments, unbonded die pads 170 may be conditioned, as well. For plating on an Aluminum surface, a Zincate process may be used to etch away a very fine layer of Aluminum from the die pads 158, 170 and redeposit a layer of Zinc (Zn) on the die pads 158, 170. The fine layer of Zinc will then act as a catalyst for the nickel plating to follow.

Once in a clean and flat state, the extracted die pads 158 and/or unbonded die pads 170 are considered conditioned die pads and are ready to be reconditioned. Reconditioning as described herein is a process whereby the original die pads 108, extracted die pads 158, and possibly unbonded die pads 170, are built up by successive and ordered application of specific metallic layers prior to adding solder balls as described herein.

In one embodiment, after an extracted die 154 has been removed from a packaged integrated circuit, only original bond wires 166 are removed—thus leaving original ball bonds 162 on less than all extracted die pads 158 of the extracted die 158. Original ball bonds 162 must be removed prior to reconditioning the extracted die pads 158. Therefore, in some embodiments the metallic layers of the present invention may be provided not to unbonded die pads 170, but rather extracted die pads 158 following original ball bond 162 removal.

Referring now to FIG. 3A, a diagram illustrating a section A-A of an electroless nickel layer application 300, in accordance with embodiments of the present invention is shown. Electroless plating is more cost effective than electroplating since it does not require expensive photolithography and etch processing or masks. However, electroless processes generally involve thicker metal layers for better wire bonding capability than to just aluminum or copper bond pads.

A nickel (Ni) layer 304 applied over a conditioned conventional aluminum (Al) or similar bond pad 108, 170, 258 have been found to protect pad surfaces. Nickel possesses a much higher elastic modulus than either copper (Cu) or aluminum (Al), which leads nickel to have high stiffness and fracture toughness and resist deflection and absorb energy during bonding processes. Thus, nickel is a preferred metallic layer 304 for the initial layer application following die pad 108, 170, 258 conditioning.

An electroless nickel plating bath is very complex and contains more chemicals (i.e. reducing agents, complexant or chelating agents, stabilizers, etc) than the nickel source alone. These bath components perform specific functions during the chemical reaction. They are important in order to obtain a good quality nickel 304 deposit and must be monitored carefully during processing.

The plating rate of nickel is a controllable parameter during the plating process, which in turn affects the final surface roughness. A fast plating rate will obviously increase the process throughput, but fast plating rates can also result in a rougher nickel finish. Therefore, a careful balance must be maintained between processing speed and surface quality. If the nickel surface is too rough, the next successive metal layers to be plated over the nickel will follow the contours and also result in a rougher surface. Both surface hardness and roughness have a strong effect on wire bondability and bond strength. Harder and rougher surfaces are typically less bondable. The electroless nickel layer 304 may be generally 120-240 microinches thick. However, since the processes of the present invention apply nickel 304 to the conditioned die pads 304, a rougher nickel layer 304 may be preferable to aid in adhesion since conventional wire bonds are not utilized. Thus, a faster nickel plating 304 process may not only be preferable for application of subsequent layers, it also increases production throughput for reconditioned die pads 348. The nickel layer 304 may be applied by any known electroless plating process.

In one embodiment, the nickel layer may be applied using a 3D printing process instead of electroless nickel plating. 3D printing has been successfully used for various forms of metal plating, including providing both conductive and non-conductive areas to surfaces of a die or semiconductor package. 3D printing may advantageously provide a higher processing throughput for a singular die than conventional plating processes, resulting in a lower cost per part.

Referring now to FIG. 3B, a diagram illustrating a section A-A of an electroless palladium layer application 320, in accordance with embodiments of the present invention is shown. Electroless palladium (Pd) 324 is applied over the electroless nickel (Ni) 304 layer of FIG. 3A in order to inhibit nickel diffusion into the immersion gold layer 344 applied in FIG. 3C.

Palladium plating 324 was first investigated as a replacement for purely gold plating in order to alleviate the high cost of gold plating. Palladium and palladium-nickel alloys were initially developed for contact wear resistance in connector applications, but other technical advantages were identified as usage grew. Not only is a pure palladium layer 324 very hard, but it is also very dense which assists as a diffusion barrier. As with the electroless nickel layer 304, the electroless palladium layer 324 requires a catalyst pretreatment to prepare the surface for deposition. The metal source is typically a palladium-ammonia compound with a hydrazine reducing agent for metal deposition. The electroless palladium layer 324 is generally 2-4 microinches thick, approximately 2 orders of magnitude thinner than the electroless nickel layer 304. The palladium layer 324 may be applied by any known electroless plating process.

In one embodiment, the palladium layer may be applied using a 3D printing process instead of an electroless process. 3D printing has been successfully used for various forms of metal plating, including providing both conductive and non-conductive areas to surfaces of a die or semiconductor package. 3D printing may advantageously provide a higher processing throughput for a singular die than conventional plating processes, resulting in a lower cost per part.

In one embodiment, there may not be a palladium layer in the stack of metallic layers applied to the die pads 108, 158, 170—since palladium is typically only deposited for better wire bonding. In that case, the gold layer 344 may be directly applied over the nickel layer 304. This may be true for conventional (i.e. ENIG) processes as well as for 3D printing processes.

Referring now to FIG. 3C, a diagram illustrating a section A-A of an immersion gold layer application 340, in accordance with embodiments of the present invention is shown. The immersion gold layer 344 is applied over and after the electroless palladium layer 324, and provides the top layer of the reconditioned die pads 348. Gold has long been a mature plating process for semiconductor applications. Two types of gold plating processes through chemical reactions are used today: immersion and autocatalytic. Immersion gold plating 344 is a self-limiting galvanic displacement process, where no reducing agent is required. The electroless gold layer 344 is generally at least 1-2 microinches thick, and preferably thicker. Following the process step of FIG. 3C, the die is a reconditioned die 348.

Because the ENEPIG (electroless nickel, electroless palladium, immersion gold) plating process uses gold as the bonding layer to solder balls, there is no aluminum (Al)— gold (Au) interface that can degrade and corrode. Thus, the ENEPIG plating process produces more reliable bonding interfaces and is preferred for high temperature and hermetic applications over previous processes that maintained Al—Au interfaces and utilize moisture getter, noble gas insertion, and vacuum bakes to purge moisture from integrated circuit packages.

In one embodiment, the gold layer may be applied using a 3D printing process instead of immersion gold plating. 3D printing has been successfully used for various forms of metal plating, including providing both conductive and non-conductive areas to surfaces of a die or semiconductor package. 3D printing may advantageously provide a higher processing throughput for a singular die than conventional plating processes, resulting in a lower cost per part.

Referring now to FIG. 3D, a diagram illustrating a section A-A of a reconditioned die after solder paste application 360, in accordance with embodiments of the present invention is shown. The combination of the electroless nickel layer 304, electroless palladium layer 324, and the immersion gold layer 344 produces reconditioned die pads 348. Once die pads have been reconditioned, a layer of solder paste 364 is applied to all reconditioned die pads 348 that will receive a solder ball. The solder paste 364 formulation and thickness should preferably be of a composition to aid in reliable bonding of the selected solder ball composition to the gold layer 344. Solder paste 364 may be applied by any known process, including but not limited to manual processes and screen printing.

Solder paste 364 is essentially powder metal solder suspended in a thick medium called flux. Flux is added to act as a temporary adhesive, holding the components until the soldering process (thermal profile) melts the solder and fuses the parts together. The solder paste 364 is typically a gray, putty-like material, and the composition of the solder paste 364 may vary. Generally, solder pastes 364 may be made of a tin-lead alloy, with possibly a third metal alloyed, although environmental protection legislation has in some embodiments required a move to lead-free solder. Therefore, lead-free solder pastes 364 may be used, as well.

Solder paste 364 is thixotropic, meaning that its viscosity changes over time with applied shear force (e.g., stirring). The thixotropic index is a measure of the viscosity of the solder paste 364 at rest, compared to "worked" paste. Depending upon the formulation of the solder paste 364, it may be very important to stir the paste 364 before it is used, to ensure that the viscosity is appropriate for proper application and retain solder balls 374 prior to exposing the solder balls to a thermal profile.

Referring now to FIG. 3E, a diagram illustrating a section A-A of new solder ball placement 370, in accordance with embodiments of the present invention is shown. One or more reconditioned die pads 348 will receive a solder ball 374 placed onto the solder paste 364. Each reconditioned die pad 348 having solder paste 364 applied to it has a corresponding solder ball 374, and reconditioned die pads 348 without solder paste 364 applied do not receive a solder ball 374 (i.e. the connection is a no connect in the new construction). Solder balls 374 may be any known metallic composition suitable for thermal soldering. A solder ball 374, also referred to as a solder bump (or, alternately referred to simply as "ball" or "bump") is a ball of solder that provides a permanent contact between a die 104, 254 and a printed circuit board, or between stacked packages in multichip modules, or between a die 104, 254 and a substrate. Solder balls 174 may be placed manually or by automated equipment, and are held in place prior to the soldering operation by the solder paste 164. The solder balls 174 may be generally spherical and of a diameter the same or less than the width of the corresponding reconditioned die pads 348 or other bond pads on another die, printed circuit board, or substrate the solder balls 174 may be soldered to. In any case, it is desirable that the diameter of solder balls 174 be selected so that at the completion of a thermal profile no solder bridging occurs between adjacent circuits on any of the die(s), printed circuit board, or substrate.

Referring now to FIG. 3F, a diagram illustrating a section A-A of new solder balls positioned prior to a thermal profile 380, in accordance with embodiments of the present invention is shown. Once the solder balls 374 have been placed on the solder paste 164, in most embodiments, the die 104, 254 with solder balls 374 is positioned and temporarily mated to another die, printed circuit board, or substrate 384. The other die, printed circuit board, or substrate 384 includes one or more bond pads 388 that require an electrical connection to die pads 108, 170, 258 the bare die 104 or modified extracted die 254 through solder balls 374. In one embodiment, the other die, printed circuit board, or substrate 384 may not include ENEPIG reconditioning processes applied to the bond pads 388 (not shown). In another embodiment, the other die, printed circuit board, or substrate 384 may include ENEPIG reconditioning processes applied to the bond pads 388 (shown in FIG. 3F). Once the bare die 104 or modified extracted die 254 has been mated as shown to the other die, printed circuit board, or substrate 384, the combined assembly is ready for the thermal profile. Details of the thermal profile depend on composition and characteristics of the solder balls 374, solder paste 364, number of connections, and size of the die(s), printed circuit board(s), or substrate (s).

Referring now to FIG. 4A, a diagram illustrating solder balls between a die and a substrate 400, in accordance with embodiments of the present invention is shown. FIG. 4A reflects the mating between a bare die 104, modified extracted die 254, or reconditioned die 352 (reconditioned die 352 shown) to another substrate 384 before applying the thermal profile to bond them together. Four die pads 108, 170, 254 are shown on the bare die 104, modified extracted die 254, or reconditioned die 352 and four bond pads 388 are present on the other substrate 384. However, since only three connections may be required, there are only three solder balls 374 present instead of four. Once solder paste 364 has been applied to the three bond pads 388 that will be bonded (not shown), the bare die 104, modified extracted die 254, or reconditioned die 352 is moved toward the other substrate 384 until the solder balls 374 make contact with the solder paste 364.

Referring now to FIG. 4B, a diagram illustrating solder balls bonded to a die and a substrate 420, in accordance with embodiments of the present invention is shown. FIG. 4B reflects a bare die 104, modified extracted die 254, or reconditioned die 352 (reconditioned die 352 shown) bonded to the other substrate 384, following application of the thermal profile. The solder balls 374 have been softened by the soldering process, and have a more flattened appearance instead of being generally spherical.

Referring now to FIG. 5A, a flowchart illustrating a reconditioning process for a bare die 500, in accordance with a first embodiment of the present invention is shown. This process converts a bare die 104 into a reconditioned die 352 of the present invention. Flow begins at block 502.

At block 502 original die pads 108 of a bare die 104 are cleaned. Cleaning may not be necessary in all cases, but may be if chemical residues or impurities are present on the original die pads 108 and unbonded die pads 170. Cleaning puts the die pads 108, 170 into an optimal condition prior to applying nickel plating to the die pads 108, 170. Flow proceeds to block 504.

At block 504, an electroless nickel layer 304 is applied to each of the cleaned original die pads 108, 170. Application details of the electroless nickel layer 304 were described in some detail with respect to FIG. 3A. Flow proceeds to optional block 506 and block 508.

At optional block 506, an electroless palladium layer 324 is applied to each of the die pads 108, 170, over the electroless nickel layer 304. Application details of the electroless palladium layer 324 were described in some detail with respect to FIG. 3B. Flow proceeds to block 508.

At block 508, an immersion gold layer 344 is applied to each of the die pads 108, 170. In one embodiment, the immersion gold layer 344 is applied over the electroless palladium layer 324. In another embodiment, the immersion gold layer 344 is applied directly over the electroless nickel layer 304. Application details of the immersion gold layer 344 were described in some detail with respect to FIG. 3C. At this point, the reworked die is a reconditioned die 352. Flow proceeds to block 510.

At block 510, solder paste 364 is applied to the reconditioned die pads 348 that will have a solder ball 374 provided. Flow proceeds to block 512.

At block 512, solder balls 174 are applied to reconditioned die pads 348 that have had solder paste 164 applied. Flow proceeds to block 514.

At block 514, the reconditioned die 352 is positioned with respect to another die, printed circuit board, or substrate 384. Positioning may in some embodiments include some form of clamping in order to maintain consistent spacing between the reconditioned die 352 and the other die, printed circuit board, or substrate 384. Flow proceeds to block 516.

At block 516, a thermal profile is applied to the assembly consisting of the reconditioned die 352 and the other die, printed circuit board, or substrate 384. The thermal profile melts the solder balls to perform the soldering operation described herein. Flow ends at block 516. Although the steps shown and described in FIG. 5A assumed conventional ENEPIG processing, it should be understood that any of the metallic layers may also be provided by metal 3D printing processes known in the art.

Referring now to FIG. 5B, a flowchart illustrating a full reconditioning process for an extracted die 520, in accordance with a second embodiment of the present invention is shown. This process converts an extracted die 154 (with original bond wires 166 and original ball bonds 162 removed) into a reconditioned die 352 of the present invention. The reconditioned die 352 is then built into a macro assembly that includes another die, printed circuit board, or substrate 384. Flow begins at block 522.

At block 522 a die 154 is extracted from a previous packaged integrated circuit. The previous package may be a hermetic or a non-hermetic package, and in either case is discarded and not reused. The extracted die 154 is a fully functional semiconductor die that will be modified to create the modified extracted die 254. Flow proceeds to block 524.

At block 524, original bond wires 166 and original ball bonds 162 are removed from the extracted die 154 by conventional processes. Flow proceeds to block 526.

At block 526, original die pads 158 that had original ball bonds 162 present and unbonded die pads 170 are cleaned. Cleaning puts the die pads 158, 170 into an optimal condition prior to applying nickel plating to the die pads 158, 170. Any metallic and/or chemical residues are removed from each of the original die pads 158 in order to prepare the original die pads 158 for addition of metallic layers to create a reconditioned die 352. Removal of the residues is commonly performed using various acid washes and rinses known in the art. Following removal of the residues and drying the extracted die pads 158, 170, the die is a modified extracted die 254 and the die pads are modified die pads 258. Flow proceeds to block 528.

At block 528, an electroless nickel layer 304 is applied to each of the cleaned modified die pads 258 and unbonded die pads 170. Application details of the electroless nickel layer 304 were described in some detail with respect to FIG. 3A. Flow proceeds to optional block 530 and block 532.

At optional block 530, an electroless palladium layer 324 is applied to each of the die pads 258, 170 of the extracted die 154, over the electroless nickel layer 304. Application details of the electroless palladium layer 324 were described in some detail with respect to FIG. 3B. Flow proceeds to block 532.

At block 532, an immersion gold layer 344 is applied to each of the die pads 258, 170. In one embodiment, the immersion gold layer 344 is applied over the electroless palladium layer 324. In another embodiment, the immersion gold layer 344 is applied directly over the electroless nickel layer 304. Application details of the immersion gold layer 344 were described in some detail with respect to FIG. 3C. At this point, the reworked die is a reconditioned die 352. Flow proceeds to block 534.

At block 534, solder paste 364 is applied to the reconditioned die pads 348 that will have a solder ball 374 provided. Flow proceeds to block 536.

At block 536, solder balls 374 are applied to reconditioned die pads 348 that have had solder paste 364 applied. Flow proceeds to block 538.

At block 538, the reconditioned die 352 is positioned with respect to another die, printed circuit board, or substrate 384. Positioning may in some embodiments include some form of clamping in order to maintain consistent spacing between the reconditioned die 352 and the other die, printed circuit board, or substrate 384. Flow proceeds to block 540.

At block 540, a thermal profile is applied to the assembly consisting of the reconditioned die 352 and the other die, printed circuit board, or substrate 384. The thermal profile melts the solder balls to perform the soldering operation described herein. Flow ends at block 540. Although the steps shown and described in FIG. 5B assumed conventional ENEPIG processing, it should be understood that any of the metallic layers may also be provided by metal 3D printing processes known in the art.

Referring now to FIG. 5C, a flowchart illustrating a partial reconditioning process for an extracted die 550, in accordance with a third embodiment of the present invention is shown. This process converts an extracted die 154 (with original bond wires 166 and original ball bonds 162 removed) into a reconditioned die 352 of the present invention. The reconditioned die 352 is then built into a macro assembly that includes another die, printed circuit board, or substrate 384. Flow begins at block 552.

At block 552 a die 154 is extracted from a previous packaged integrated circuit. The previous package may be a hermetic or a non-hermetic package, and in either case is discarded and not reused. The extracted die 154 is a fully functional semiconductor die that will be modified to create the modified extracted die 254. Flow proceeds to block 554.

At block 554, original bond wires 166 and original ball bonds 162 are removed from the extracted die 154 by conventional processes. Flow proceeds to block 556.

At block 556, original die pads 158 that had original ball bonds 162 present are cleaned. Unbonded die pads 170, which did not previously have original ball bonds 162 or original bone wires 166 present, are not cleaned. Cleaning puts the die pads 158 into an optimal condition prior to applying nickel plating to the die pads 158, 170. Any metallic and/or chemical residues are removed from each of the original die pads 158 in order to prepare the original die pads 158 for addition of metallic layers to create a reconditioned die 352. Removal of the residues is commonly performed using various acid washes and rinses known in the art. Following removal of the residues and drying the extracted die pads 158, the die is a modified extracted die 254 and the die pads are modified die pads 258 and unbonded die pads 170. Flow proceeds to block 558.

At block 558, an electroless nickel layer 304 is applied to each of the cleaned modified die pads 258 and unbonded die pads 170. Application details of the electroless nickel layer 304 were described in some detail with respect to FIG. 3A. Flow proceeds to optional block 560 and block 562.

At optional block 560, an electroless palladium layer 324 is applied to each of the die pads 258, 170, over the electroless nickel layer 304. Application details of the electroless palladium layer 324 were described in some detail with respect to FIG. 3B. Flow proceeds to block 562.

At block 562, an immersion gold layer 344 is applied to each of the die pads 258, 170. In one embodiment, the immersion gold layer 344 is applied over the electroless palladium layer 324. In another embodiment, the immersion gold layer 344 is applied directly over the electroless nickel layer 304. Application details of the immersion gold layer 344 were described in some detail with respect to FIG. 3C. At this point, the reworked die is a reconditioned die 352. Flow proceeds to block 564.

At block 564, solder paste 364 is applied to the reconditioned die pads 348 that will have a solder ball 374 provided. Flow proceeds to block 566.

At block 566, solder balls 374 are applied to reconditioned die pads 348 that have had solder paste 364 applied. Flow proceeds to block 568.

At block 568, the reconditioned die 352 is positioned with respect to another die, printed circuit board, or substrate 384. Positioning may in some embodiments include some form of clamping in order to maintain consistent spacing between the reconditioned die 352 and the other die, printed circuit board, or substrate 384. Flow proceeds to block 570.

At block 570, a thermal profile is applied to the assembly consisting of the reconditioned die 352 and the other die, printed circuit board, or substrate 384. The thermal profile melts the solder balls to perform the soldering operation described herein. Flow ends at block 570. Although the steps shown and described in FIG. 5C assumed conventional ENEPIG processing, it should be understood that any of the metallic layers may also be provided by metal 3D printing processes known in the art.

Finally, those skilled in the art should appreciate that they can readily use the disclosed conception and specific embodiments as a basis for designing or modifying other structures for carrying out the same purposes of the present invention without departing from the spirit and scope of the invention as defined by the appended claims.

It will be readily understood that the components of the application, as generally described and illustrated in the figures herein, may be arranged and designed in a wide variety of different configurations. Thus, the detailed description of the embodiments is not intended to limit the scope of the application as claimed, but is merely representative of selected and exemplary embodiments of the application.

One having ordinary skill in the art will readily understand that the application as discussed above may be practiced with steps in a different order, and/or with hardware elements in configurations that are different than those which are specifically disclosed. Therefore, although the application has been described based upon these preferred embodiments, it would be apparent to those of skill in the art that certain modifications, variations, and alternative constructions would be apparent, while remaining within the spirit and scope of the application. In order to determine the metes and bounds of the application, therefore, reference should be made to the present claims.

While preferred embodiments of the present application have been described, it is to be understood that the embodiments described are illustrative only and the scope of the application is to be defined solely by the appended claims when considered with a full range of equivalents and modifications (e.g., protocols, hardware devices, software platforms etc.) thereto.

I claim:

1. A method comprising:
    conditioning one or more die pads of a singular die;
    applying a nickel layer to the one or more die pads;
    applying a gold layer over the nickel layer;
    applying a solder paste over the gold layer;
    applying one or more solder balls to the solder paste;
    mating the one or more solder balls to one or more bond pads of another die, a printed circuit board, or a substrate; and
    soldering the singular die to the other die, the printed circuit board, or the substrate by baking the singular die mated to the other die, the printed circuit board, or the substrate using a thermal profile.

2. The method of claim 1, wherein conditioning the one or more die pads comprises:
    removing one or more of metallic residue and chemical deposits from the one or more die pads.

3. The method of claim 1, wherein the singular die comprises an extracted die removed from an integrated circuit package, wherein prior to conditioning the one or more die pads the method comprises:
    removing one or more of ball bonds and bond wires from die pads of the extracted die, wherein the extracted die comprises a fully functional semiconductor die with one or more ball bonds on the one or more die pads.

4. The method of claim 3, wherein only die pads of the extracted die previously having a ball bond are conditioned.

5. The method of claim 1, further comprising:
    applying a palladium layer over the nickel layer; and
    applying the gold layer over the palladium layer instead of over the nickel layer.

6. The method of claim 5, wherein applying the nickel layer, applying the palladium layer, and applying the gold layer comprises:
    3D printing, by a 3D printer, the nickel layer to the one or more die pads;
    3D printing the palladium layer over the nickel layer; and
    3D printing the gold layer over the palladium layer.

7. The method of claim 1, wherein a diameter of the solder balls is equal to or less than a width of the one or more die pads and the one or more bond pads.

* * * * *